United States Patent
Kung et al.

(10) Patent No.: US 9,331,280 B2
(45) Date of Patent: May 3, 2016

(54) TRANSPARENT ELECTROCHROMIC POLYIMIDE, METHOD FOR MANUFACTURING THE SAME, AND ELECTROCHROMIC DEVICE UTILIZING THE SAME

(71) Applicant: INDUSTRIAL TECHNOLOGY RESEARCH INSTITUTE, Chutung, Hsinchu (TW)

(72) Inventors: Yu-Ruei Kung, New Taipei (TW); Chyi-Ming Leu, Jhudong Township (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 121 days.

(21) Appl. No.: 13/865,287

(22) Filed: Apr. 18, 2013

(65) Prior Publication Data

US 2014/0146380 A1    May 29, 2014

(30) Foreign Application Priority Data

Nov. 27, 2012  (TW) .............................. 101144265 A

(51) Int. Cl.

| | |
|---|---|
| *G02F 1/15* | (2006.01) |
| *G02F 1/153* | (2006.01) |
| *G02B 5/23* | (2006.01) |
| *H01L 51/00* | (2006.01) |
| *B32B 17/10* | (2006.01) |
| *C09K 9/00* | (2006.01) |
| *C09K 9/02* | (2006.01) |

(52) U.S. Cl.
CPC ...... *H01L 51/0035* (2013.01); *B32B 17/10513* (2013.01); *C09K 9/00* (2013.01); *C09K 9/02* (2013.01); *G02F 1/15* (2013.01); *G02F 2001/1515* (2013.01)

(58) Field of Classification Search
CPC ................... B32B 17/10513; H01L 27/3232; H01L 51/0035; G02F 1/15; G02F 1/161; G02F 2001/1512; G02F 2001/1515; C09K 9/00; C09K 9/02
USPC .............. 359/265, 273, 321, 322; 252/501.1, 252/583, 586; 345/49, 105; 348/817
See application file for complete search history.

(56) References Cited

U.S. PATENT DOCUMENTS

| | | | | |
|---|---|---|---|---|
| 4,402,573 A | * | 9/1983 | Jones | G02F 1/1521 252/600 |
| 6,950,220 B2 | * | 9/2005 | Abramson | G02F 1/15 359/265 |
| 7,270,858 B2 | | 9/2007 | Yamaoka et al. | |
| 7,340,938 B2 | * | 3/2008 | Li | G01N 33/005 73/23.2 |
| 2009/0149661 A1 | | 6/2009 | Reynolds et al. | |
| 2009/0221763 A1 | | 9/2009 | Reynolds et al. | |
| 2009/0247717 A1 | * | 10/2009 | Liaw | 526/259 |
| 2011/0046330 A1 | | 2/2011 | Beaujuge et al. | |
| 2011/0275781 A1 | * | 11/2011 | Liaw | 528/186 |

FOREIGN PATENT DOCUMENTS

| | | |
|---|---|---|
| CN | 202404340 U | 8/2012 |
| WO | WO 03/022955 A1 | 3/2003 |

OTHER PUBLICATIONS

Der-Jang Liawa, Kung-Li Wang, Ying-Chi Huang, Kueir-Rarn Lee, Juin-Yih Lai, Chang-Sik Ha. Advanced polyimide materials: Syntheses, physical properties and applications. Progress in Polymer Science 37 (2012) 907-974, published Mar. 1, 2012.*

Yoshiyuki Oishi, Mina Ishida, Masa-Aki Kakimoto, Yoshio Imai, and Toshikazu Kurosaki. Preparation and Properties of Novel Soluble Aromatic Polyimides from 4,4'-Diaminotriphenylamine and Aromatic Tetracarboxylic dianhydrides. Journal of Polymer Science: Part A: Polymer Chemistry, vol. 30, 1027-1035 (1992).*

Yi-Chun Kung, Guey-Sheng Liou, Sheng-Huei Hsiao. Synthesis and Characterization of Novel Electroactive Polyamides and Polyimides with Bulky 4-(1-Adamantoxy)triphenylamine Moieties. Journal of Polymer Science: Part A: Polymer Chemistry, vol. 47, 1740-1755 (2009).*

Masatoshi Hasegawa, Daiki Hirano, Mari Fujii, Misako Haga, Eiichiro Takezawa, Shinya Yamaguchi, Atsushi Ishikawa, Takashi Kagayama. Solution-Processable Colorless Polyimides Derived from Hydrogenated Pyromellitic Dianhydride with Controlled Steric Structure. Journal of Polymer Science, Part A: Polymer Chemistry 2013, 51, 575-592.*
Cha-Wen Chang, Hung-Ju Yen, Kuan-Yeh Huang,3 Jui-Ming Yeh, Guey-Sheng Liou. Novel Organosoluble Aromatic Polyimides Bearing Pendant Methoxy-Substituted Triphenylamine Moieties: Synthesis, Electrochromic, and Gas Separation Properties. Journal of Polymer Science: Part A: Polymer Chemistry, vol. 46, 7937-7949 (2008).*
Report on Carcinogens, Thirteenth Edition. 4,4'-oxydianiline. First listed in the Fifth Annual Report on Carcinogens (1989). National Toxicology Program, Department of Health and Human Services.*
Beaujuge, P.M. et al, "Color Control in π-Conjugated Organic Polymers for Use in Electrochromic Devices," Chem. Rev., 2010, vol. 110, pp. 268-320.
Chang, C.W. et al., "Novel Organosoluble Aromatic Polyimides Bearing Pendant Methoxy-Substituted Triphenylamine Moieties: Synthesis, Electrochromic, and Gas Separation Properties," Journal of Polymer Science, Part A: Polymer Chemistry, 2008, vol. 46, pp. 7937-7949.
Hsiao, S.H. et al, "Novel Aromatic Polyamides and Polyimides Functionalized with 4-tert-Butyltriphenylamine Groups," Journal of Polymer Science: Part A: Polymer Chemistry, 2006, vol. 44, pp. 4579-4592.
Hsiao, S.H. et al, "Synthesis and characterization of electrochromic poly(amide-imide)s based on the diimide-diacid from 4,4'-diamino-4''-methoxytriphenylamine and trimellitic anhydride," European Polymer Journal, 2010, vol. 46, pp. 1355-1366.
Hsiao, S.H. et al, "Synthesis and characterization of electrochromic poly(amide-imide)s bearing methoxy-substituted triphenylamine units," Materials Chemistry and Physics, 2011, vol. 130, pp. 1086-1093.
Huang, L.T. et al, "Substituent Effect on Electrochemical and Electrochromic Behaviors of Ambipolar Aromatic Polyimides Based on Aniline Derivatives," Macromolecules, 2011, vol. 44, pp. 9595-9610.
Itoh, E. et al, "Electrostatic phenomena at film/film interface in polyimide Langmuir-Blodgett films," Journal of Electrostatics, 1996, vol. 36, pp. 313-321.
Itoh, E. et al, "Temperature and Photoirridation Dependence of Electrostatic Phenomena at Metal/Polyimide LB film interface," International Symposium on Electrical Insulating Materials, Sep. 1995, pp. 339-342.
Itoh, E. et al, "Temperature dependence of electrostatic phenomena at the electrode-polyimide LB film interface before and after photoirridation," Thin Solid Films, 1996, vols. 284-285, pp. 545-548.
Iwamoto, M. et al, "Electrical Transport and Electrostatic Properties of Polyimide Langmuir-Blodgett films," Synthetic Metals, 1995, vol. 71, pp. 1981-1984.
Iwamoto, M. et al, "Surface Potential of Polyimide Langmuir-Blodgett Films Induced by Photoirridation," Jpn. J. Appl. Phys., 1994, vol. 33, pp. L1616-L1619.
Kung, Y.C. et al, "Synthesis and Characterization of Novel Electroactive Polyamides and Polyimides with Bulky 4-(1-Adamantoxy)triphenylamine Moieties," Journal of Polymer Science: Part A: Polymer Chemistry, 2009, vol. 47, pp. 1740-1755.
Nishikata, Y. et al, "Preparation of polyimide Langmuir-Blodgett films possessing a triphenylamine unit and their application to photodiodes," Thin Solid Films, 1992, vols. 210/211, pp. 296-298.
Reeves, B.D. et al, "Defunctionalization of Ester-Substituted Electrochromic Dioxythiophene Polymers," Macromolecules, 2007, vol. 40, pp. 5344-5352.
Unur, E. et al, "Black to Transmissive Switching in a Pseudo Three-Electrode Electrochromic Device," Chem. Mater., 2009, vol. 21, pp. 5145-5153.
Walczak, R.M. et al, "3,4-Alkylenedioxypyrrole-Based Conjugated Polymers with Finely Tuned Electronic and Optical Properties via a Flexible and Efficient N-Functionalization Method," Macromolecules, 2007, vol. 40, pp. 7777-7785.

Taiwanese Office Action dated Sep. 4, 2014, issued in corresponding Taiwanese Patent Application No. 101144265.
Chinese Office Action for Appl. No. 201210544327.6 dated Aug. 19, 2015.
Li, et al, "Jianming Rongji Shouce", Chemical Industry Press, Jan. 31, 2009, pp. 310-311.

* cited by examiner

*Primary Examiner* — Bumsuk Won
*Assistant Examiner* — Collin X Beatty
(74) *Attorney, Agent, or Firm* — Birch, Stewart, Kolasch & Birch, LLP

(57) ABSTRACT

Disclosed is a transparent electrochromic polyimide, polymerized of a diamine and a cycloaliphatic dianhydride. The diamine includes a diamino triphenylamine having the formula:

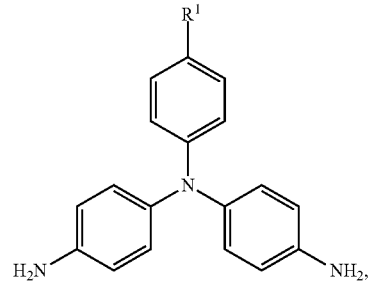

wherein $R^1$ consists of hydrogen, halogen, $C_{1-6}$ alkyl group, $C_{1-6}$ alkoxy group, or

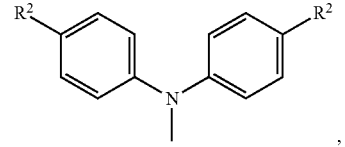

and $R^2$ consists of hydrogen, halogen, $C_{1-6}$ alkyl group, or $C_{1-6}$ alkoxy group. The cycloaliphatic dianhydride includes

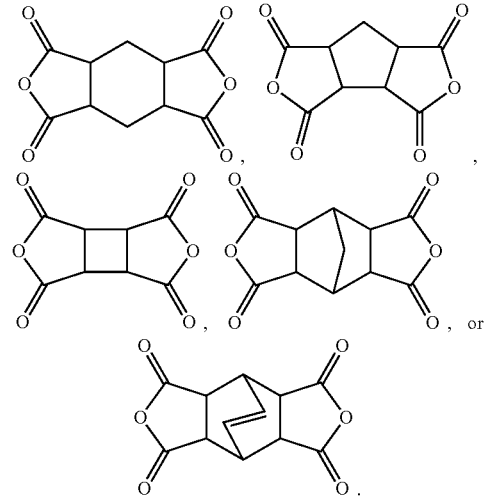

8 Claims, 1 Drawing Sheet

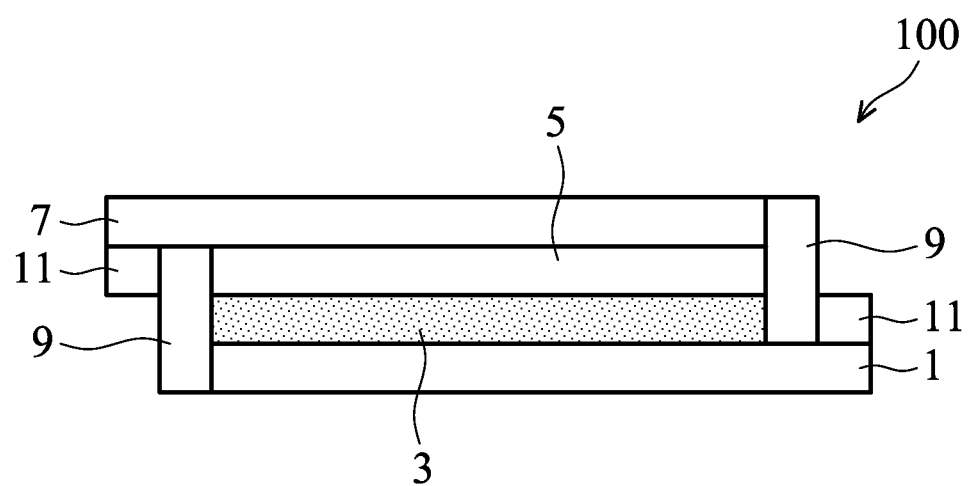

TRANSPARENT ELECTROCHROMIC POLYIMIDE, METHOD FOR MANUFACTURING THE SAME, AND ELECTROCHROMIC DEVICE UTILIZING THE SAME

CROSS REFERENCE TO RELATED APPLICATIONS

The present application is based on, and claims priority from, Taiwan Application Serial Number 101144265, filed on Nov. 27, 2012, the disclosure of which is hereby incorporated by reference herein in its entirety.

TECHNICAL FIELD

The technical field relates to a transparent polyimide, and in particular to its application of an electrochromic device.

BACKGROUND

Electrochromic devices are attractive in green energy industries due to their low driving voltage and bistable properties. Major electrochromic materials are inorganic oxide for longer lifetime and endurance, however, films thereof are prepared by expensive processes and equipment such as vacuum deposition, spray pyrolysis, or sputtering. Even ignoring the cost of processing, the inorganic oxide still has shortcomings such as slow electrochromic rate, less color variation, and the likes. Most electrochromic organic materials are conjugated polymer with more color variation and fast electrochromic rates. However, the electrochromic conjugated polymer has shortcomings such as expensive monomers, a complicated synthesis, and formation by electro-polymerization. Therefore, the conjugated polymer with a low molecular weight has a size limited by the electrode size of the electro-polymerization. In other words, it is difficult to form the organic electrochromic material with a large area. On the other hand, the electrochromic conjugated polymer has an appearance of deep color due to its conjugated length. Although the deep color can be lightened by applying a voltage, the conjugated polymer cannot be fully transparent. In other words, the conjugated polymer must be electrified to affect a transparent state, thereby leading to the problem of high energy consumption.

Accordingly, a novel electrochromic organic material to meet the requirements of transparency, film firming ability, and electrochromicity is called-for.

SUMMARY

One embodiment of the disclosure provides a transparent electrochromic polyimide, polymerized of a diamine and a cycloaliphatic dianhydride, wherein the diamine comprises a diamino triphenylamine having the formula:

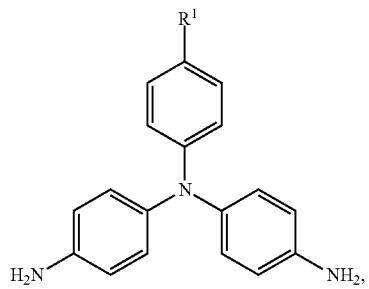

wherein $R^1$ consists of hydrogen, halogen, $C_{1-6}$ alkyl group, $C_{1-6}$ alkoxy group, or

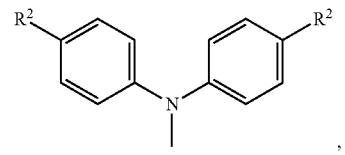

and $R^2$ consists of hydrogen, halogen, $C_{1-6}$ alkyl group, or $C_{1-6}$ alkoxy group; and the cycloaliphatic dianhydride comprises

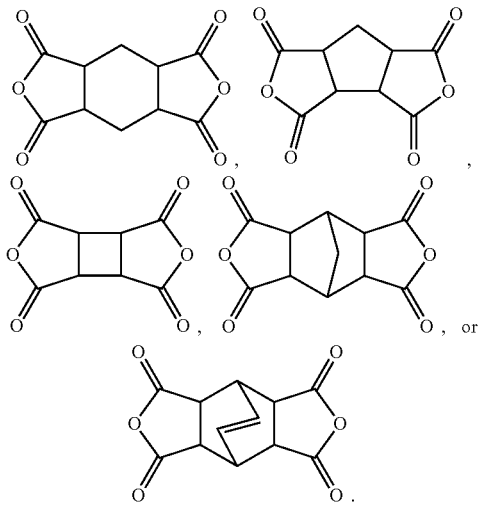

One embodiment of the disclosure provides an electrochromic device, comprising: a first transparent conductive layer; an electrolyte layer disposed on the first conductive layer; a layer of the transparent electrochromic polyimide as claimed in claim 1 disposed on the electrolyte layer; and a second transparent conductive layer on the layer of the transparent electrochromic polyimide.

One embodiment of the disclosure provides a method of forming a transparent electrochromic polyimide, comprising: mixing a diamine, a cycloaliphatic dianhydride, a catalyst, and an organic solvent to form a mixture; heating the mixture to form a transparent electrochromic polyimide by reacting the diamine and the cycloaliphatic dianhydride in a one-step reaction; wherein the diamine comprises a diamino triphenylamine having the formula:

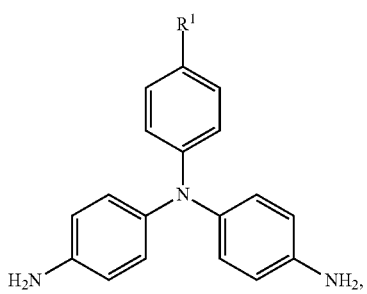

wherein $R^1$ consists of hydrogen, halogen, $C_{1-6}$ alkyl group, $C_{1-6}$ alkoxy group, or

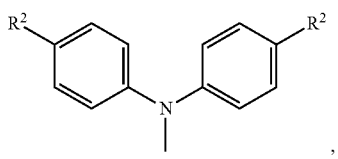

and R² consists of hydrogen, halogen, $C_{1-6}$ alkyl group, or $C_{1-6}$ alkoxy group; and the cycloaliphatic dianhydride comprises

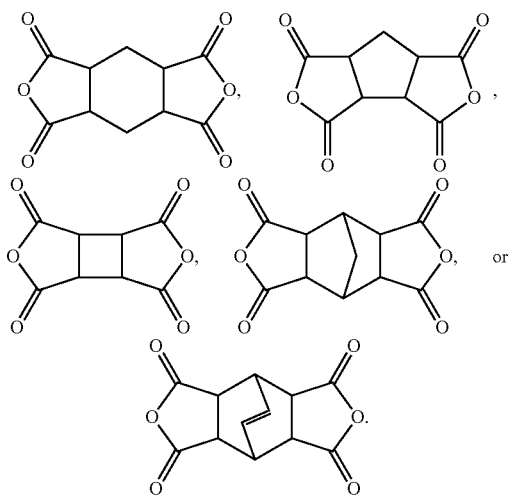

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 1 shows an electrochromic device in one embodiment of the disclosure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

One embodiment of the disclosure provides a transparent electrochromic polyimide polymerized of a diamine and a cycloaliphatic dianhydride by a one-step reaction. The diamine includes a diamino triphenylamine as shown in Formula 1.

(Formula 1)

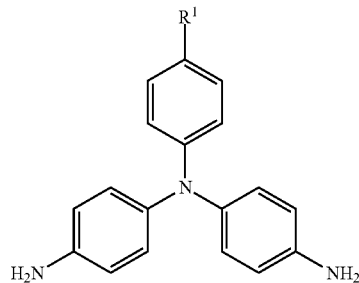

In Formula 1, $R^1$ consists of hydrogen, halogen, $C_{1-6}$ alkyl group, $C_{1-6}$ alkoxy group, or diphenylamino group as shown in Formula 2.

(Formula 2)

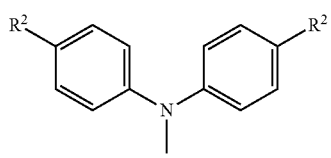

In Formula 2, $R^2$ consists of hydrogen, halogen, $C_{1-6}$ alkyl group, or $C_{1-6}$ alkoxy group.

The cycloaliphatic dianhydride can be dianhydrides as shown in Formulae 3, 4, 5, 6, 7, or other suitable cycloaliphatic dianhydrides.

(Formula 3)

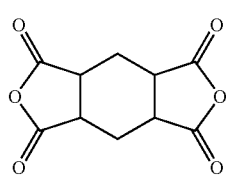

(Formula 4)

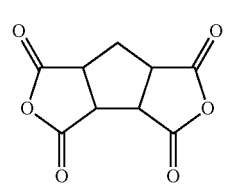

(Formula 5)

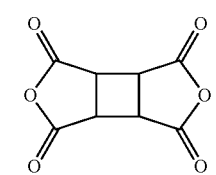

(Formula 6)

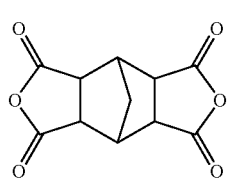

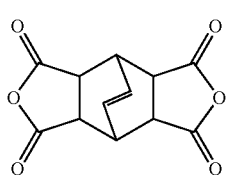
(Formula 7)

In another embodiment of the disclosure, the diamine further includes an ether diamine, and the diamino triphenylamine and the ether diamine have a molar ratio of greater than or equal to 20:80 and less than 100:0. If the diamine contains an overly low amount of the diamino triphenylamine, the polyimide will not be obviously electrochromic due to an overly low optical transmittance change during the electrification of the polyimide. The ether diamine can be a para-substituted diamine as shown in Formula 8-1, an meta-substituted diamine as shown in Formula 8-2, a diamine as shown in Formula 9 ($R^3$ is phenylene, biphenylene, 2,2-diphenylpropylene, 2,2-hexafluorodiphenylpropylene, 2,2-diphenyldiisopropylphenylene, or 2,2-diphenylsulfone), or another suitable ether diamine. It should be understood that the polyimide polymerized from the diamine further containing the ether diamine can be a random copolymer, a block copolymer, or an alternative copolymer. In one embodiment, the polyimide polymerized from the diamine further containing the ether diamine is a random copolymer.

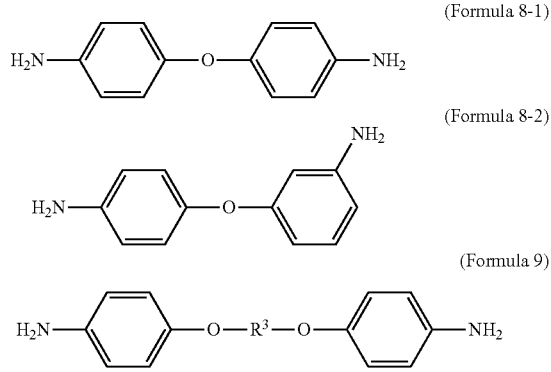

In one embodiment, the diamine, the cycloaliphatic dianhydride, a catalyst, and an organic solvent are evenly mixed to form a mixture. The mixture is heated, such that the diamine and the cycloaliphatic dianhydride are further reacted to form the transparent electrochromic polyimide. In one embodiment, the transparent electrochromic polyimide has a weight average molecular weight of 1,000 to 300,000. Alternatively, the transparent electrochromic polyimide has a weight average molecular weight of 120,000 to 150,000. A transparent electrochromic polyimide with an overly high weight average molecular weight has an insufficient solubility. A transparent electrochromic polyimide with an overly low weight average molecular weight has an insufficient film-forming ability.

The catalyst of the polymerization can be triethylamine, tripropylamine, tributylamine, pyridine, 2-methylpyridine, 3-methylpyridine, 4-methylpyridine, 2,4-dimethylpyridine, 2-ethylpyridine, 3-ethylpyridine, 4-ethylpyridine, quinoline, iso-quinoline, 2-methylquinoline, or combinations thereof. In one embodiment, the organic solvent has a boiling point of 150° C. to 220° C. An organic solvent with an overly high boiling temperature will be difficult to remove during the film-forming process. An organic solvent with an overly low boiling temperature cannot achieve the desired polymerization temperature. For example, the suitable organic solvent can be N-methyl-2-pyrrolidone (NMP) or m-cresol.

The transparent electrochromic polyimide will be transferred from being colorless to having a specific color (e.g. deep blue) after being electrified with a suitable voltage. The specific color and the voltage depend on the chemical structure of the transparent electrochromic polyimide. As shown in FIG. 1, the transparent electrochromic polyimide solution is wet coated on a transparent conductive layer 1. The solvent of the coating is removed by baking to form the transparent electrochromic polyimide film 3. Subsequently, an electrolyte is formed on the transparent electrochromic polyimide film 3 by the similar wet coating to complete a layered device. A transparent conductive layer 7 is then attached to the layered device, and a sealing-glue 9 such as epoxy resin is coated on the attaching portion of the two transparent conductive layers 1 and 7. A conductive material 11 such copper serving as a working electrode is attached thereto to complete an electrochromic device 100.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLES

Preparation Example 1

61.58 g (0.5 mole) of 4-methoxyaniline, 167.1 g (1.1 mole) of cesium fluoride, and 141.1 g (1.0 mole) of p-fluoronitrobenzene (1.0 mole) were weighted and put into a 2 L reaction tank. 0.6 L of DMSO was then added into the reaction tank. The mixture in the reaction tank was heated to 120° C. and reacted at 120° C. for 8 hours under nitrogen, and then cooled to room temperature. The cooled reaction was poured into ethanol to precipitate a solid, and then filtered to collect the solid. The solid was washed by ethanol and then dried to obtain a dinitro product. 54.8 g (0.15 mole) of the dinitro product, 680 mL of ethanol, and 0.5 g of 10% active carbon palladium (Pd/C) were put into a 2 L reaction tank under nitrogen. The mixture was heated to reflux for 4 hours, and 60 mL of hydrazine was gradually added into the reaction tank to chemically reduce the dinitro product. The refluxed reaction was immediately filtered to remove the active carbon palladium, and the filtration was cooled to obtain a white diamine crystal. The white diamine crystal was collected by filtering and then dried for following Examples and Comparative Examples. The reaction is shown in Formula 11, and the spectra data of the diamine product is shown as follows. IR (KBr): 3454, 3339 $cm^{-1}$ (N—H stretch). $^1$H NMR (DMSO-$d_6$, ppm): 3.65 (s, 3H, $OCH_3$), 4.82 (s, 4H, $NH_2$), 6.48 (d, 2H), 6.68 (d, 2H), 6.69-6.73 (m, 4H). $^{13}$C NMR (DMSO-$d_6$, d, ppm): 55.4 ($OCH_3$), 114.5, 115.0, 121.2, 125.8, 137.7, 143.2, 144.5, 153.0.

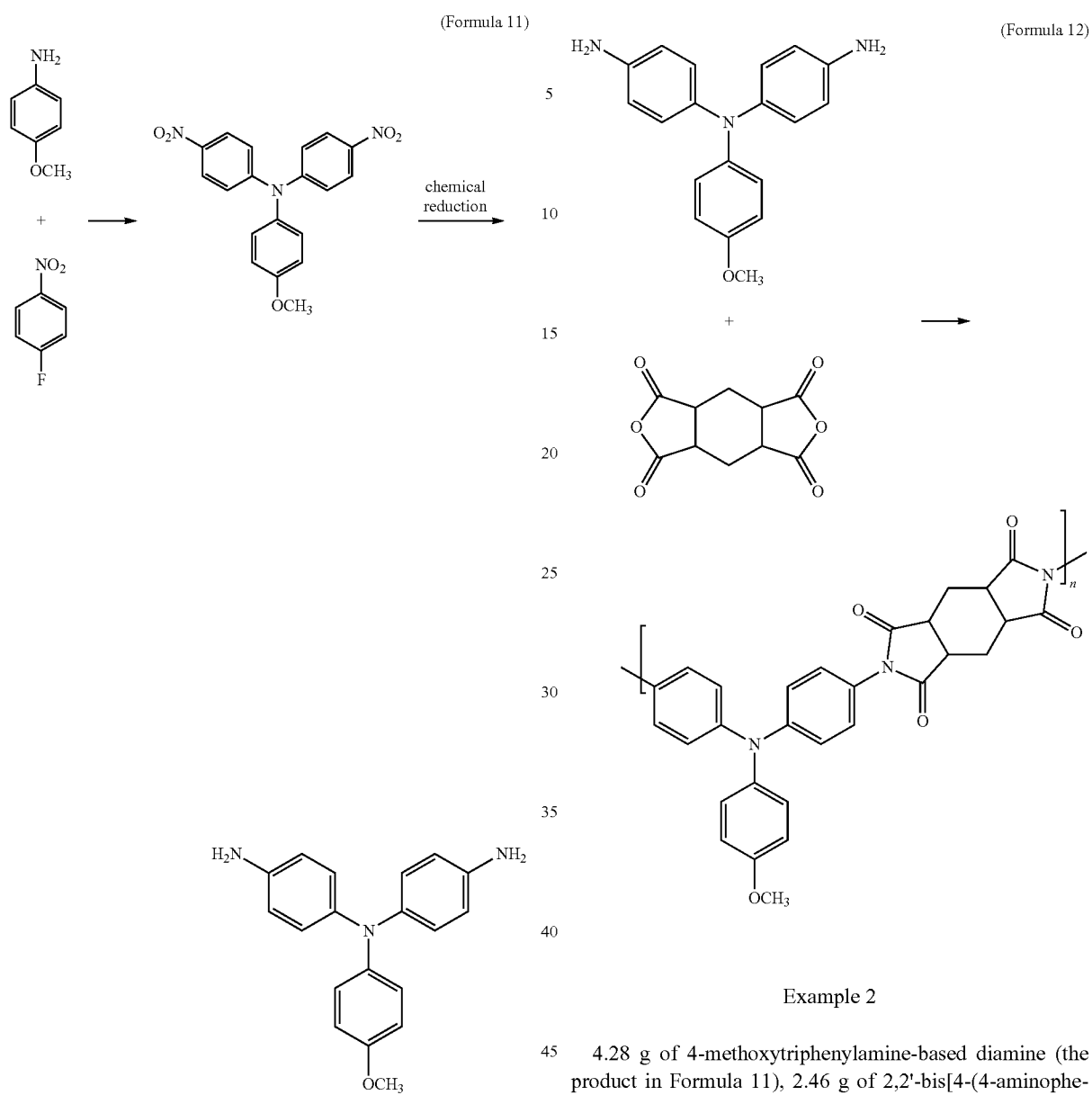

Example 1

5.77 g of 4-methoxytriphenylamine-based diamine (the product in Formula 11) and 4.24 g of hydrogenated pyromellitic dianhydride were mixed in a reaction flask. 23.3 g of NMP serving as a solvent was added into the reaction flask, and 0.2 g of iso-quinoline serving as a catalyst was then added into the reaction flask. The mixture in the reaction flask was heated to 210° C. for 4 hours to obtain a yellow viscous solution. The reaction is shown in Formula 12, wherein n is 50 to 300. The spectra data of dried thin film derived from the yellow viscous solution is shown as follows. IR (film, cm$^{-1}$): 2935, 2935, 1774, 1709. $^1$H-NMR (DMSO-d$_6$, δ, ppm): 2.14 (4H), 3.11 (4H), 3.73 (3H), 6.97 (2H), 7.03 (4H), 7.10 (2H), 7.17 (4H). $^{13}$C-NMR (DMSO-d$_6$, δ, ppm): 36.8, 55.4, 68.4, 115.4, 122.0, 126.0, 128.2, 139.1, 147.2, 156.8, 178.4. GPC data: $M_w$=168,469, $M_n$=131,026.

Example 2

4.28 g of 4-methoxytriphenylamine-based diamine (the product in Formula 11), 2.46 g of 2,2'-bis[4-(4-aminophenoxy)phenyl]propane (BAPP), and 4.96 g of bicyclo[2.2.2]oct-7-ene-2,3,5,6-tetracarboxylic dianhydride were mixed in a reaction flask. 27.3 g of NMP serving as a solvent was added into the reaction flask, and 0.2 g of iso-quinoline serving as a catalyst was then added into the reaction flask. The mixture in the reaction flask was heated to 210° C. for 4 hours to obtain a yellow viscous solution. The reaction is shown in Formula 13, wherein m is 35 to 140, n is 50 to 300, and m and n have a ratio of 7:3. It should be understood that the product in Formula 13 is a random copolymer other than a block copolymer. The spectra data of the dried thin film derived from yellow viscous solution is shown as follows. IR (film, cm$^{-1}$): 2964, 2837, 1772, 1712. $^1$H-NMR (DMSO-d$_6$, δ, ppm): 1.94, 3.36, 3.51, 3.72, 6.24, 6.93-7.01, 7.12, 7.24. $^{13}$C-NMR (DMSO-d$_6$, δ, ppm): 34.0, 41.8, 55.3, 63.3, 65.6, 68.3, 69.2, 69.9, 115.4, 118.5, 122.0, 125.7, 127.0, 127.8, 128.1, 128.2, 128.6, 131.0, 139.1, 145.8, 147.2, 153.9, 156.8, 176.8. GPC data: $M_w$=129,234, $M_n$=119,499

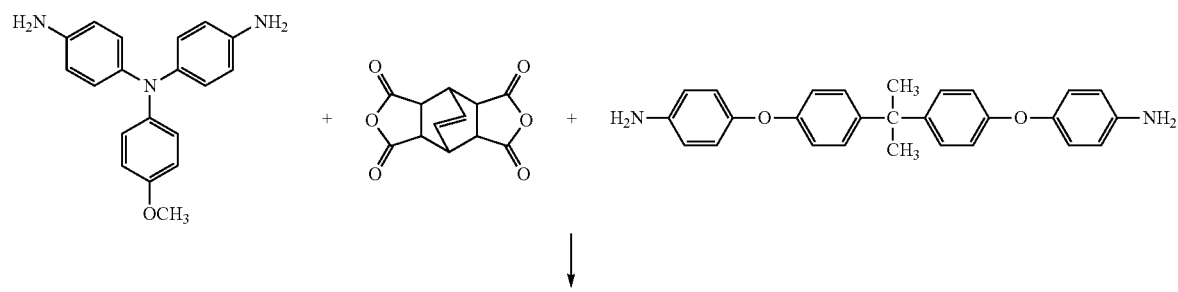

(Formula 13)

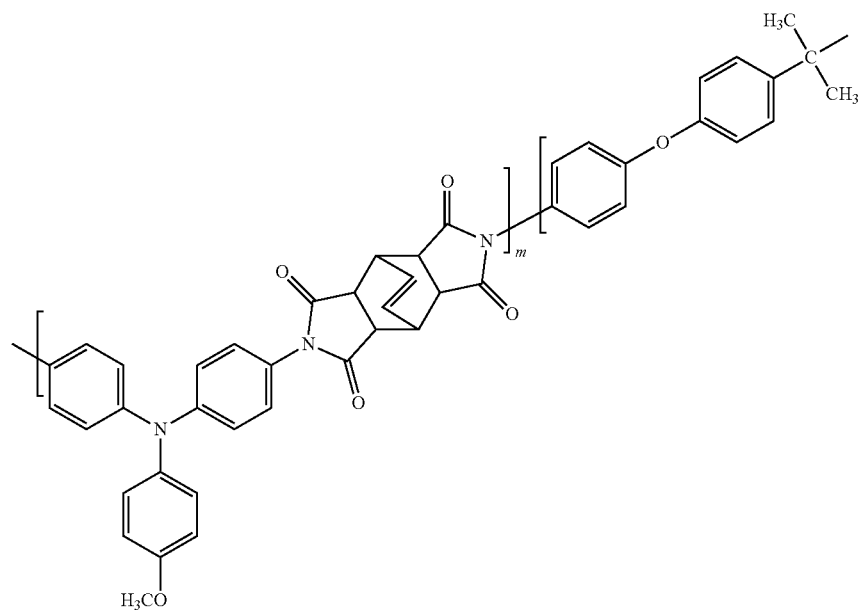

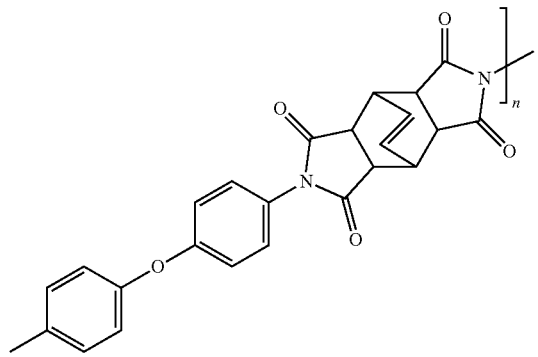

Comparative Example 1

4.07 g of 4-methoxytriphenylamine-based diamine (the product in Formula 11) and 4.24 g of 4,4'-(hexafluoroisopropylidene)diphthalic anhydride (6FDA) were mixed in a reaction flask. 23.3 g of NMP serving as a solvent was added into the reaction flask, and 0.2 g of iso-quinoline serving as a catalyst was then added into the reaction flask. The mixture in the reaction flask was heated to 210° C. for 4 hours to obtain an orange red viscous solution. The reaction is shown in Formula 14, wherein n is 50 to 215. It should be understood that the product in Formula 14 is a random copolymer other than a block copolymer. The spectra data of the dried thin film derived from orange red viscous solution is shown as follows. IR (film, cm$^{-1}$): 1786, 1722. $^1$H-NMR (DMSO-d$_6$, δ, ppm): 3.74, 6.98, 7.09, 7.16, 7.31, 7.74, 7.93, 8.14.

(Formula 14)

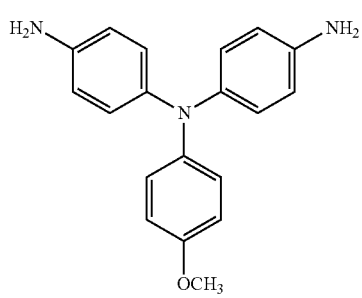

+

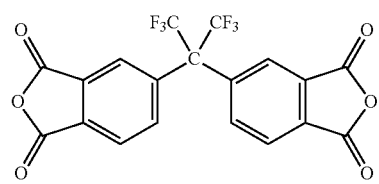

→

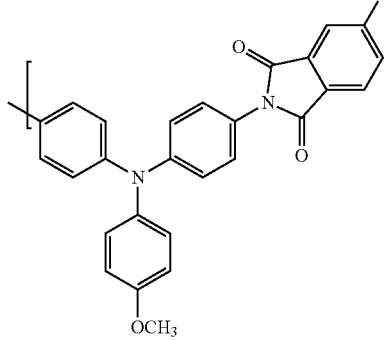

(Formula 15)

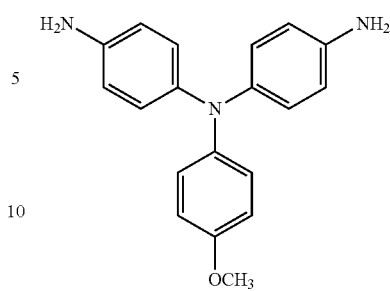

+

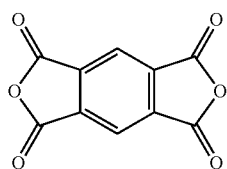

→

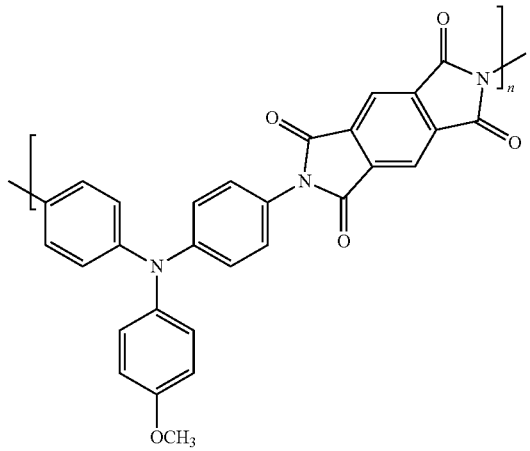

Comparative Example 3

2.8025 g (0.014 mole) of 4,4'-oxydianiline, 2.4631 g (0.006 mole) of BAPP, and 4.9636 g (0.02 mole) of bicyclo[2.2.2]oct-7-ene-2,3,5,6-tetracarboxylic dianhydride were mixed in a reaction flask. 23.87 g of NMP serving as a solvent was added into the reaction flask, and 0.2 g of iso-quinoline serving as a catalyst was then added into the reaction flask. The mixture in the reaction flask was heated to 210° C. and reacted at 210° C. for 4 hours to obtain a yellow viscous solution. The reaction is shown in Formula 16, wherein m is 35 to 140, n is 15 to 60, and m and n has a ratio of 7:3. It should be understood that the product in Formula 16 is a random copolymer other than a block copolymer. The spectra data of the yellow viscous solution is shown as follows. IR (film, cm$^{-1}$): 2963, 2838, 1773, 1714. $^1$H-NMR (DMSO-d$_6$, δ, ppm): 1.63, 3.41-3.59, 6.29, 6.96, 7.06, 7.12-7.14, 7.18, 7.26.

Comparative Example 2

2.917 g (9.55 mmole) of 4-methoxytriphenylamine-based diamine (the product in Formula 11) and 2.083 g of pyromellitic dianhydride (9.55 mmole) were mixed in a reaction flask. 11.67 g of NMP serving as a solvent was added into the reaction flask, and 0.05 g of iso-quinoline serving as a catalyst was then added into the reaction flask. The mixture in the reaction flask was heated to 210° C. and reacted at 210° C. for 0.5 hours to precipitate a brown cake. Even more solvent could not dissolve the brown cake. In short, the solubility of the brown cake is too low to form a film. The reaction is shown in Formula 15.

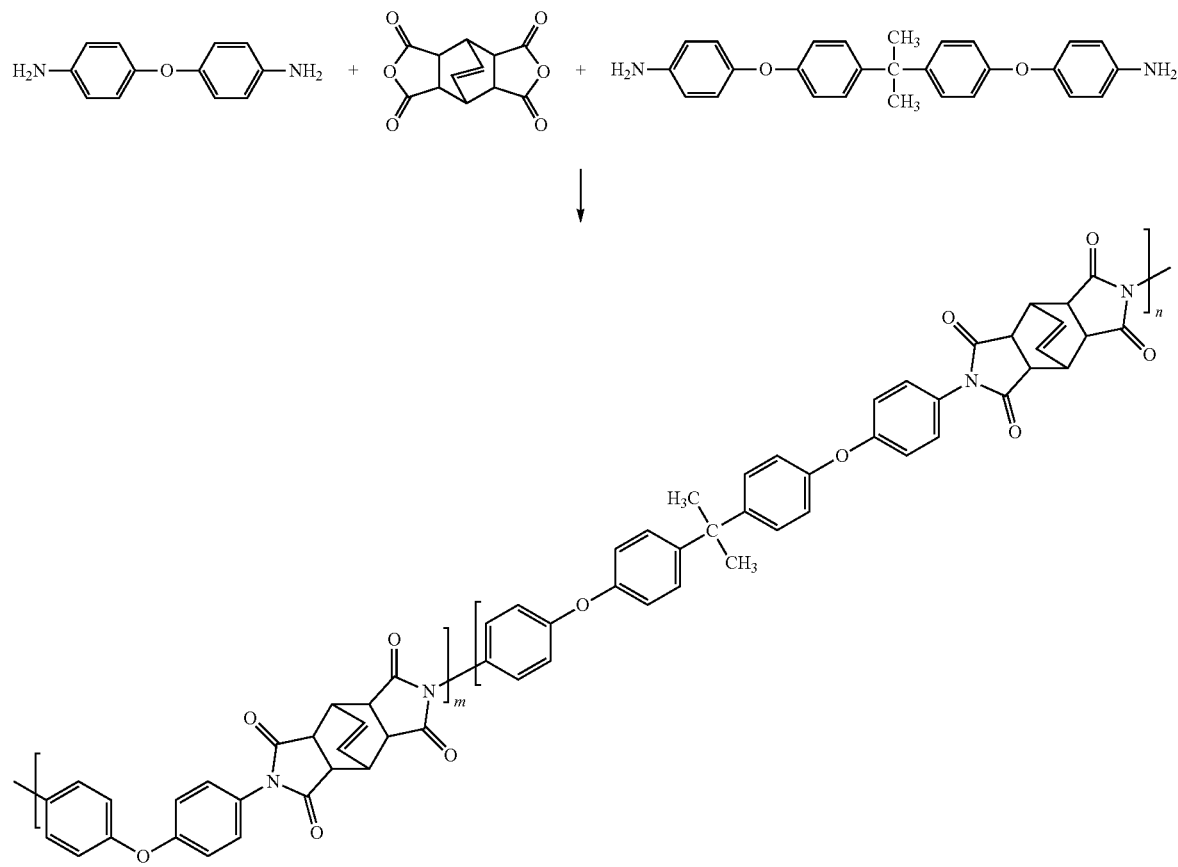

(Formula 16)

Comparative Example 4

7.7373 g (0.021 mole) of 4,4'-(1,1'-biphenyl-4,4'-diyldioxy)dianiline, 3.6946 g (0.009 mole) of BAPP, and 7.4457 g (0.03 mole) of bicyclo[2.2.2]oct-7-ene-2,3,5,6-tetracarboxylic dianhydride were mixed in a reaction flask. 44.04 g of NMP serving as a solvent was added into the reaction flask, and 0.28 g of iso-quinoline serving as a catalyst was then added into the reaction flask. The mixture in the reaction flask was heated to 210° C. and reacted at 210° C. for 4 hours to obtain a yellow viscous solution. The reaction is shown in Formula 17, wherein m is 42 to 175, n is 18 to 75, and m and n has a ratio of 7:3. It should be understood that the product in Formula 17 is a random copolymer other than a block copolymer. The spectra data of the yellow viscous solution is shown as follows. IR (film, cm$^{-1}$): 2963, 2837, 1772, 1714. $^1$H-NMR (DMSO-d$_6$, δ, ppm): 1.63, 3.43-3.53, 6.29-6.30, 6.96, 7.05, 7.13, 7.18, 7.25, 7.68.

(Formula 17)
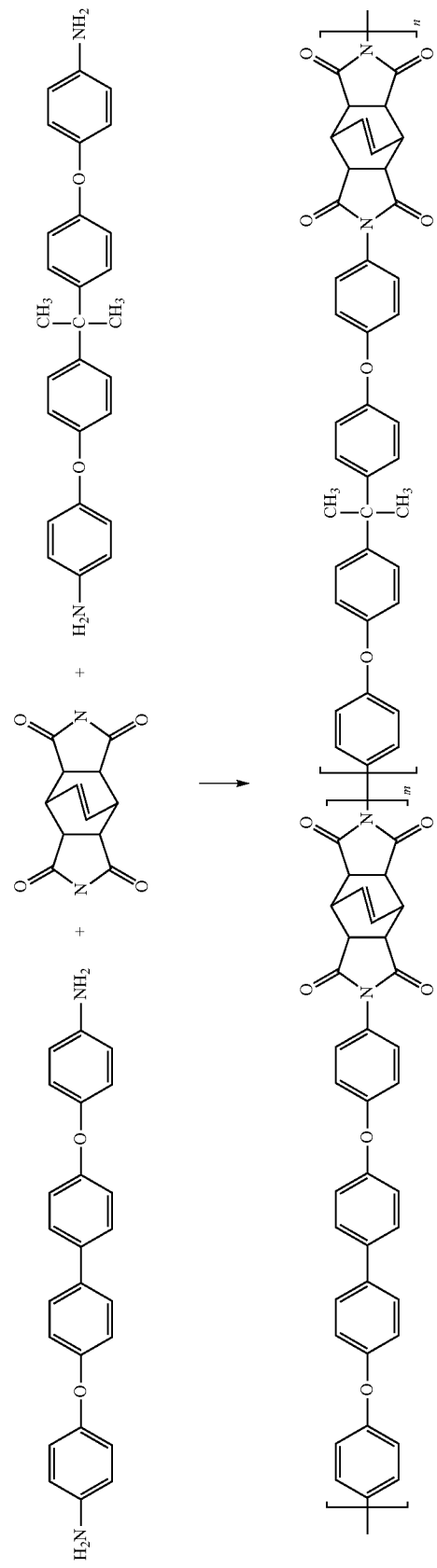

Example 3

The polyimides prepared in Examples 1 to 2 and Comparative Examples 1 to 4 were dissolved in dimethylacetamide (DMAc) and diluted by DMAc to an appropriate concentration, respectively. The polyimide solution was coated on a glass substrate by blade coating to form a film with a thickness of 15 μm. The film was baked at a temperature of 50° C. for 0.5 hour, and then baked at a temperature of 140° C. for 15 minutes to obtain a polyimide film. As shown in appearance, The polyimide films of Examples 1 to 2 and Comparative Examples 3 to 4 were transparent (colorless), and the polyimide film of Comparative Example 1 was opaque yellow. In Comparative Example 2, polyimide was brown cake not dissolved in DMAc, and low molecular weigh imide oligomer dissolved in DMAc.

The electrochemical properties of the polyimide films were then measured to monitor colors of the polyimide films under different voltages. The DMAc solution of the polyimide or copolymer thereof was coated on an ITO glass to serve as a working electrode. 0.1 M acetonitrile ($CH_3CN$) solution of TBAP served as an electrolyte, and ferrocene (Fc) served as a standard. The polyimide films of Examples 1 or 2 were applied a voltage from 0V to 1.25 V, such that the appearance of the polyimide films was transferred from transparent (colorless) to deep blue. The polyimide film of Comparative Example 1 was applied a voltage from 0V to 1.25 V, such that the appearance of the polyimide film was transferred from opaque yellow to blue. The polyimide film of Comparative Examples 3 or 4 were applied a voltage from 0V to 1.25 V, but the appearance of the polyimide films remained transparent (colorless) (no electrochromicity). The low molecular weigh imide oligomer (dissolved in DMAc) film of Comparative Example 2 was applied a voltage from 0V to 1.25 V, such that the appearance of the imide oligomer film was transferred from opaque brown to blue.

The physical properties of the polyimides in Examples 1 to 2 and Comparative Example 1 to 4 are tabulated in Table 1.

TABLE 1

| | Film-forming ability | Solubility in organic solvent | Appearance before applying voltage | Electro-chromism |
|---|---|---|---|---|
| Example 1 | Yes | Soluble | Transparent | Yes |
| Example 2 | Yes | Soluble | Transparent | Yes |
| Comparative Example 1 | Yes | Soluble | Opaque deep yellow | Yes |
| Comparative Example 2 | No, precipitated during polymerization | Insoluble | Brown cake without film forming ability | Yes |
| Comparative Example 3 | Yes | Soluble | Transparent | No |
| Comparative Example 4 | Yes | Soluble | Transparent | No |

As described, if the diamine for forming the polyimide dose not contain the diamino triphenylamine, the polyimide will lose electrochromicity. On the other hand, if the dianhydride for forming the polyimide is the aromatic dianhydride other than the cycloaliphatic dianhydride, the polyimide will not be transparent without being electrified.

Example 4

ITO layer with a thickness of 0.7 mm was sputtered on a 12 inch glass layer to complete a transparent conductive layer (ITO glass). Subsequently, 12.5 g of PMMA, 2.5 g of $LiClO_4$, 38.85 g of acetonitrile, 15.0 g of ethylene carbonate (EC), and 15.0 g of propylene carbonate (PC) were mixed and slowly heated to 50° C. to form a electrolyte gel. 12 inch of polyimide (the product in Formula 12) film was coated on the conductive surface of the ITO glass, and then baked to remove the solvent thereof. The electrolyte gel was coated on the transparent electrochromic film, and then attached to another ITO glass. Thereafter, the attaching portions of the two transparent conductive layers were coated by sealing epoxy resin to complete a simple electrochromic device. A voltage of 2.4 V was applied to the polyimide film through an external line and the ITO layer, such that the appearance of the electrochromic device was transferred from transparent (colorless) to deep blue.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A transparent electrochromic formed by polymerization of a diamine and a cycloaliphatic dianhydride, wherein the diamine comprises a diamino triphenylamine having the formula

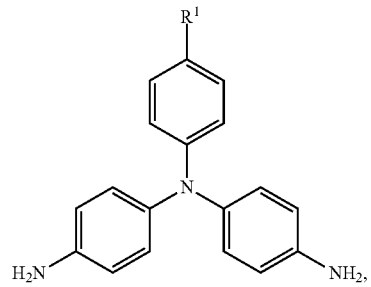

Wherein R1 consists of hydrogen, halogen, $C_{1-6}$ alkyl group, $C_{1-6}$ alkoxy group, or

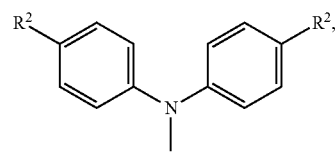

and R2 consists of hydrogen, halogen, $C_{1-6}$ alkyl group, $C_{1-6}$ alkoxy group; and the cycloaliphatic dianhydride comprises

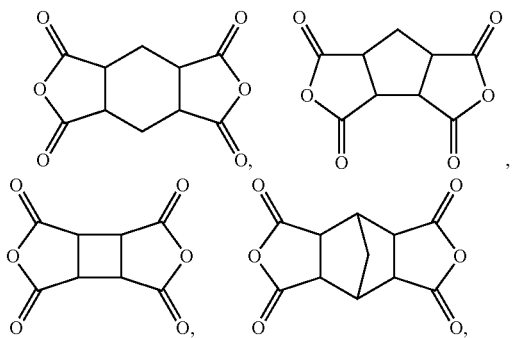, 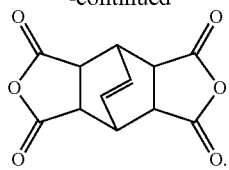

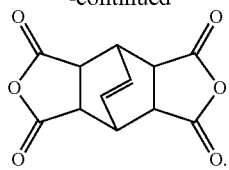

wherein the resulting polymer is sufficiently soluble in an organic solvent having a boiling point of 150° C. to 220° C. to form a film, and wherein the resulting polymer is configured to, when placed into a film, transfer from colorless to color upon application of a voltage.

2. The transparent electrochromic polyimide as claimed in claim 1, wherein the diamine further comprises an ether amine, and the ether diamine comprises

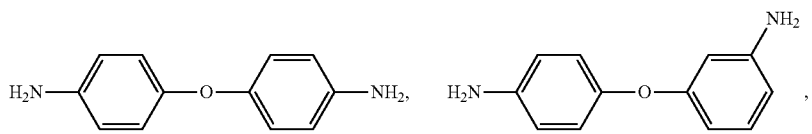

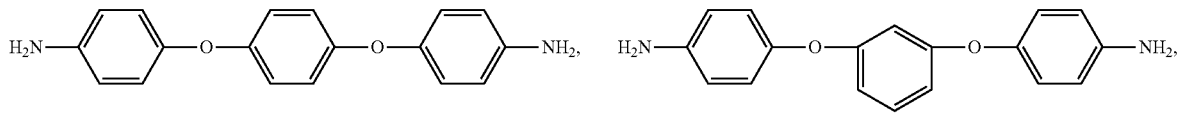

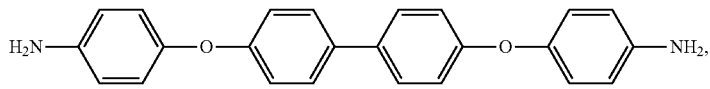

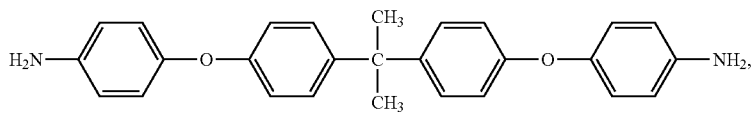

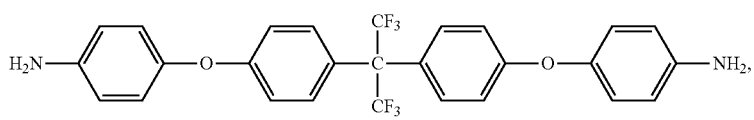

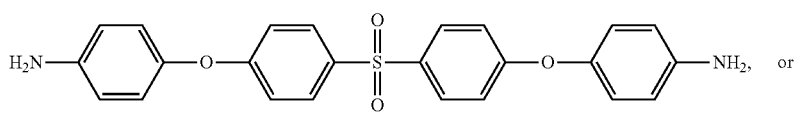, or

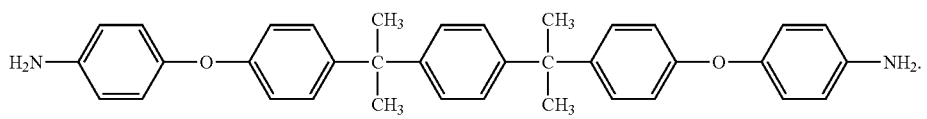

3. The transparent electrochromic polyimide as claimed in claim 2, wherein the diamino triphenylamine and the ether diamine have a molar ratio of greater than or equal to 20:80 and less than 100:0.

4. An electrochromic device, comprising:
a first transparent conductive layer;
an electrolyte layer disposed on the first conductive layer;
a layer of the transparent electrochromic polyimide as claimed in claim 1 disposed on the electrolyte layer; and
a second transparent conductive layer on the layer of the transparent electrochromic polyimide.

5. A method of forming a transparent electrochromic, comprising:
mixing a diamine, a cycloaliphatic dianhydride, a catalyst, and an organic solvent to form a mixture;
heating the mixture to form a transparent electrochromic polyimide by reacting the diamine and the cycloaliphatic dianhydride in a one-step reaction;
wherein the diamine comprises a diamino triphenylamine having the formula

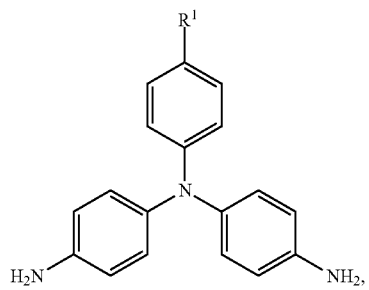

Wherein R1 consists of hydrogen, halogen, $C_{1-6}$ alkyl group, $C_{1-6}$ alkoxy group, or

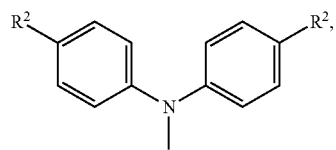

and R2 consists of hydrogen, halogen, $C_{1-6}$ alkyl group, $C_{1-6}$ alkoxy group; and
the cycloaliphatic dianhydride comprises

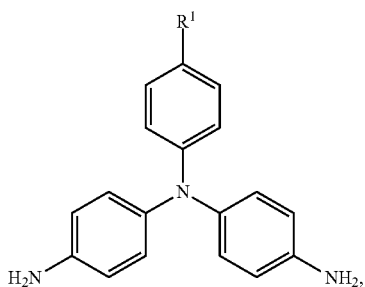

wherein the resulting polymer is sufficiently soluble in an organic solvent having a boiling point of 150° C. to 220° C. to form a film, and
wherein the resulting polymer is configured to, when placed into a film, transfer from colorless to color upon application of a voltage.

6. The method as claimed in claim 5, wherein the diamine further comprises an ether amine, and the ether diamine comprises

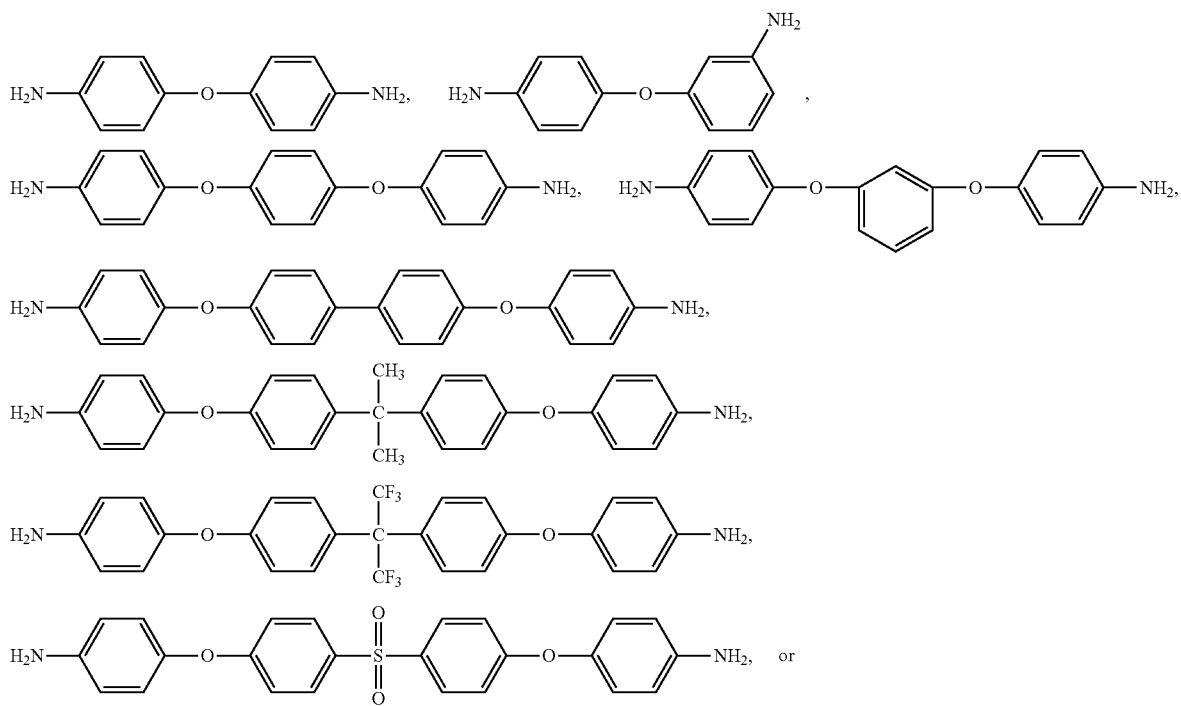

-continued

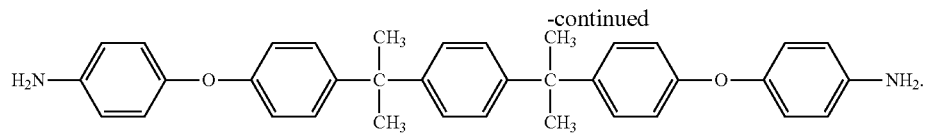

7. The method as claimed in claim 6, wherein the diamino triphenylamine and the ether diamine have a molar ratio of greater than or equal to 20:80 and less than 100:0.

8. The method as claimed in claim 5, wherein the catalyst comprises triethylamine, tripropylamine, tributylamine, pyridine, 2-methylpyridine, 3-methylpyridine, 4-methylpyridine, 2,4-dimethylpyridine, 2-ethylpyridine, 3-ethylpyridine, 4-ethylpyridine, quinoline, iso-quinoline, 2-methylquinoline, or combinations thereof.

* * * * *